United States Patent
Cao et al.

(10) Patent No.: US 11,340,021 B2
(45) Date of Patent: May 24, 2022

(54) HEAT EXCHANGER MODULE

(71) Applicant: SHENZHEN ENVICOOL TECHNOLOGY CO., LTD, Shenzhen (CN)

(72) Inventors: Wenqiang Cao, Shenzhen (CN); Qingzhen Zeng, Shenzhen (CN); Jun Liu, Shenzhen (CN)

(73) Assignee: SHENZHEN ENVICOOL TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 15/766,831

(22) PCT Filed: Jun. 8, 2017

(86) PCT No.: PCT/CN2017/087621
§ 371 (c)(1),
(2) Date: Apr. 9, 2018

(87) PCT Pub. No.: WO2017/215513
PCT Pub. Date: Dec. 21, 2017

(65) Prior Publication Data
US 2018/0292144 A1  Oct. 11, 2018

(30) Foreign Application Priority Data
Jun. 13, 2016 (CN) .......................... 201620569983.5

(51) Int. Cl.
*F28D 15/02* (2006.01)
*H05K 7/20* (2006.01)
(Continued)

(52) U.S. Cl.
CPC ........ *F28D 15/0275* (2013.01); *F25B 23/006* (2013.01); *F25B 39/00* (2013.01);
(Continued)

(58) Field of Classification Search
CPC ............. F28D 15/0233; F28D 15/0275; F28D 15/025; F28D 1/0435; H05K 7/2029; H05K 7/20309; F24F 12/002
See application file for complete search history.

(56) References Cited

U.S. PATENT DOCUMENTS

| | | | | | |
|---|---|---|---|---|---|
| 4,688,399 | A | * | 8/1987 | Reimann | F28D 15/0266 165/104.14 |
| 6,026,891 | A | * | 2/2000 | Fujiyoshi | F28D 15/0233 165/104.33 |

(Continued)

FOREIGN PATENT DOCUMENTS

| | | |
|---|---|---|
| CN | 1556912 A | 12/2004 |
| CN | 201039641 Y | 3/2008 |

(Continued)

*Primary Examiner* — Jianying C Atkisson
*Assistant Examiner* — For K Ling
(74) *Attorney, Agent, or Firm* — Bayramoglu Law Offices LLC

(57) ABSTRACT

A heat exchanger module includes a condenser unit and an evaporator unit. The evaporator unit includes N pieces of parallel-flow heat exchangers arranged adjacently, and the coolant temperatures reduce gradually from the first to Nth parallel-flow heat exchangers along an air flow direction in the evaporator unit. A counter-current mounting method is adopted in the parallel-flow heat exchangers of the evaporator unit in the heat exchanger module provided by the present invention. The coolant temperature of each parallel-flow heat exchanger is lower than that of the previous one, the temperature difference between air and coolant is relatively uniform by using the counter-current method so as to reach a better heat exchange effect.

19 Claims, 2 Drawing Sheets

(51) Int. Cl.
*G06F 1/20* (2006.01)
*F25B 39/00* (2006.01)
*F25B 23/00* (2006.01)
*F25B 39/02* (2006.01)
*F25B 39/04* (2006.01)

(52) U.S. Cl.
CPC ............ *F25B 39/028* (2013.01); *F25B 39/04* (2013.01); *G06F 1/20* (2013.01); *H05K 7/20663* (2013.01); *H05K 7/20681* (2013.01); *F28D 2015/0216* (2013.01); *G06F 2200/201* (2013.01)

(56) References Cited

U.S. PATENT DOCUMENTS

| | | | | |
|---|---|---|---|---|
| 6,039,111 A | * | 3/2000 | Kawaguchi | F28D 15/0266 165/104.14 |
| 6,119,767 A | * | 9/2000 | Kadota | F28D 15/0233 165/104.33 |
| 6,745,830 B2 | * | 6/2004 | Dinh | F28D 15/0266 165/104.25 |
| 2011/0271696 A1 | * | 11/2011 | Hedberg | F28D 15/0266 62/64 |
| 2012/0186787 A1 | * | 7/2012 | Dinh | F24F 12/002 165/104.26 |
| 2013/0221774 A1 | * | 8/2013 | Agostini | H02K 9/18 310/64 |
| 2015/0077938 A1 | * | 3/2015 | Espersen | F28D 15/0266 361/700 |

FOREIGN PATENT DOCUMENTS

| | | | | |
|---|---|---|---|---|
| CN | 201497102 U | 6/2010 | | |
| CN | 101886836 A | 11/2010 | | |
| CN | 205808194 U | 12/2016 | | |
| JP | 60071895 A | * | 1/1998 | ......... F28D 15/0266 |
| JP | 2007292352 A | 11/2007 | | |

* cited by examiner

HEAT EXCHANGER MODULE

CROSS REFERENCE TO RELATED APPLICATIONS

This application is the national phase entry of International Application PCT/CN2017/087621, filed on Jun. 8, 2017, which is based upon and claims priority to Chinese Patent Application No. 201620569983.5, filed on Jun. 13, 2016, the entire contents of which are incorporated herein by reference.

TECHNICAL FIELD

The present invention relates to a heat exchanger module, in particular to a heat exchanger module used in a data center cabinet.

BACKGROUND

With the development of technology, the heat generated by communication equipment is getting higher and higher. With the original size unchanged, the heat generated by the internal equipment of the cabinet increases in multiples, and the increased internal temperature of the cabinet affects the working stability of the equipment. As a result, on the premise of not changing the size of the equipment cabinet, there is an urgent need for a radiator, which is small in size, large in refrigerating capacity and is capable of reasonably utilizing the space inside and outside the cabinet to meet the installation requirements, so as to solve the heat dissipation problem of high heat flux.

A parallel-flow heat exchanger includes a plurality of heat exchanger tubes (usually flat tubes) or a plurality of heat exchange tubes and corrugated fins arranged on the heat exchange tubes, and the two ends of the parallel-flow heat exchanger are provided with header pipes; the parallel-flow heat exchanger has been applied in the field of cabinet heat dissipation because of the high heat exchange efficiency and compact structure of the parallel-flow heat exchanger. But the heat dissipation effect of the single parallel-flow heat exchanger is limited, and the heat transfer ability of the single parallel-flow heat exchanger is not enough to meet the heat dissipation requirement of the cabinet.

SUMMARY OF THE INVENTION

The purpose of the present invention is to provide a heat exchanger module with simple structure and good heat dissipation effect.

In order to achieve the above purpose, the present invention uses the following technical solution.

A heat exchanger module, including: a condenser unit and an evaporator unit; the evaporator unit includes N pieces of parallel-flow heat exchangers arranged adjacently, N≥2; the coolant temperatures of the first to Nth parallel-flow heat exchangers along an air flow direction in the evaporator unit reduce gradually.

Further, the condenser unit includes a corresponding number of parallel-flow heat exchangers, the coolant temperatures of the first to Nth parallel-flow heat exchangers along the air flow direction in the condenser unit increase gradually.

Further, the first to Nth parallel-flow heat exchangers of the evaporator unit are connected to the Nth to first parallel-flow heat exchangers of the condenser unit by the coolant pipes, respectively.

Further, two parallel-flow heat exchangers connected by the coolant pipe constitute an independent coolant circulation system.

Further, the internal fluid of the coolant circulation system can be refrigerants or secondary refrigerants.

Further, a circulation pump is provided in the coolant circulation system.

Further, the parallel-flow heat exchangers are integrally mounted by fasteners.

Further, the connecting part of the adjacent parallel-flow heat exchangers is provided with seals.

Further, the parallel-flow heat exchangers are integrally mounted by sheet metal parts.

Further, the sheet metal parts are arranged at the connecting part of the adjacent parallel flow-heat exchangers.

According to the technical scheme, a counter-current mounting method is adopted in the parallel-flow heat exchanger of the evaporator unit in the heat exchanger module, namely the coolant temperatures of a plurality of parallel-flow heat exchangers arranged adjacently reduce gradually along the air flow direction, the high-temperature air flow firstly passes through the parallel-flow heat exchanger with the highest coolant temperature, and the coolant temperature of the parallel-flow heat exchanger is lower than the coolant temperature of the previous parallel-flow heat exchanger, and the air flow temperature decreases after passing through the parallel-flow heat exchanger, the temperature difference between air and the coolant is relatively uniform by using the counter-current method so as to reach a better heat exchange effect. In addition, the heat transfer efficiency is further improved by gradually increasing the coolant temperatures of a plurality of parallel-flow heat exchangers arranged adjacently in the condenser unit along the air flow direction.

BRIEF DESCRIPTION OF THE DRAWINGS

In order to more clearly illustrate the embodiments of the present invention, the drawings used in the description of the embodiments or the prior art will be briefly described below. Obviously, the drawings in the following description are merely some embodiments of the present invention, for those of ordinary skill in the art, other drawings can also be obtained based on these drawings without any creative work.

DETAILED DESCRIPTION OF THE INVENTION

The present invention will be described in detail with reference to the accompanying drawings, in the detailed description of the embodiments of the present invention, for ease of illustration, the drawings showing the structure of the devices are partially enlarged and not to scale, and the schematic diagrams are merely exemplary in nature and are not intended to limit the scope of protection of the invention. It should be noted that the drawings use a simplified form and non-precise proportion, which is only used for convenience and clarity to illustrate the embodiments of the present invention.

Embodiment 1

Figure 1:
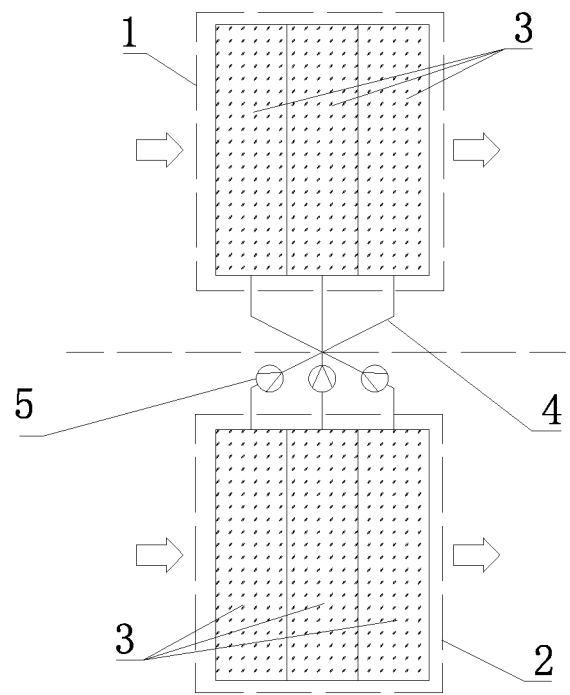
FIG. 1 is a schematic structural diagram of Embodiment 1 of the present invention.

As shown in FIG. 1, the heat exchanger module of this embodiment includes a condenser unit 1 that performs heat exchange with the outdoor air flow and an evaporator unit 2 that performs heat exchange with the indoor air flow, for example, the condenser unit can be disposed outside the cabinet (or outdoors), and the evaporator unit may be disposed inside the cabinet (or indoors). The condenser unit 1 includes N pieces of parallel-flow heat exchangers, wherein N≥2. In the embodiment, the condenser unit 1 includes 3 pieces of parallel-flow heat exchangers 3, and the parallel-flow heat exchangers 3 are arranged adjacently, the parallel-flow heat exchangers of the embodiment are connected integrally by screws or rivets, and sealing cotton or sealant acting as a seal is arranged at the connecting part of the adjacent parallel-flow heat exchangers 3, so as to prevent the gaps between adjacent parallel-flow heat exchangers 3 from leaking and affecting the heat transfer. The evaporator unit 2 includes a plurality of parallel-flow heat exchangers 3 corresponding to the number of parallel-flow heat exchangers in the condenser unit, the parallel-flow heat exchangers 3 of the condenser unit 1 and the parallel-flow heat exchangers 3 of the evaporator unit 2 are connected by coolant pipes 4.

The direction indicated by the hollow arrow in FIG. 1 is the air flow direction. The coolant temperatures of the parallel-flow heat exchangers of the evaporator unit 2 reduce gradually along the air flow direction, that is, the coolant temperatures of the first, second, and third parallel-flow heat exchanger sequentially arranged along the air flow direction in the evaporator unit 2 gradually reduce, and the coolant temperatures of the parallel-flow heat exchangers in the condenser unit 1 gradually increase along the air flow direction, that is, the coolant temperatures of the first, second, and third parallel-flow heat exchanger sequentially arranged along the air flow direction in the condenser unit 1 gradually increase, and the first, second and third parallel-flow heat exchanger of the evaporator unit 2 are connected to the third, second and first parallel-flow heat exchanger of the condenser unit 1 by coolant pipes, respectively. In the embodiment, the pipes connecting the parallel-flow heat exchangers in the condenser unit 1 and the evaporator unit 2 are cross-connected, and the refrigerant flows between the condenser unit and the evaporator unit. Two parallel-flow heat exchangers connected by the coolant pipes constitute an independent coolant circulation system. The internal fluid of the coolant circulation system can be refrigerants or secondary refrigerants, such as water, glycol etc. In addition, circulation pumps 5 for supplying circulating power can be added to the coolant circulating system.

As shown in FIG. 1, along the direction of the arrow, the coolant temperature of the first parallel-flow heat exchanger 3 of the evaporator unit 2 through which the air flow in the cabinet passes is the highest, the high-temperature air in the cabinet firstly performs heat exchange with the first parallel-flow heat exchanger 3 of the evaporator unit 2, then passes through the second parallel-flow heat exchanger 3 of the evaporator unit 2, the coolant temperature of the second parallel-flow heat exchanger 3 is lower than the coolant temperature of the first parallel-flow heat exchanger, the air performs heat exchange with the second parallel-flow heat exchanger 3, and finally performs heat exchange with the third parallel-flow heat exchanger 3 of the evaporator unit 2, the coolant temperature of the third parallel-flow heat exchanger 3 is the lowest, and the coolant temperatures of the parallel-flow heat exchangers in the evaporator unit reduce gradually along the air flow direction, so that the temperature difference between the refrigerant and the air is uniform, and the heat dissipation effect is better. Similarly, the air flow outside the cabinet firstly passes through the first parallel-flow heat exchanger with the lowest coolant temperature in the condenser unit 1, and then sequentially passes through the second and the third parallel-flow heat exchanger with gradually increasing coolant temperatures, since the temperature of the air outside the cabinet is also higher and higher, the temperature difference between the refrigerants in the three parallel-flow heat exchangers and the air flow is more uniform, and the heat dissipation effect is improved.

Embodiment 2

Figure 2:
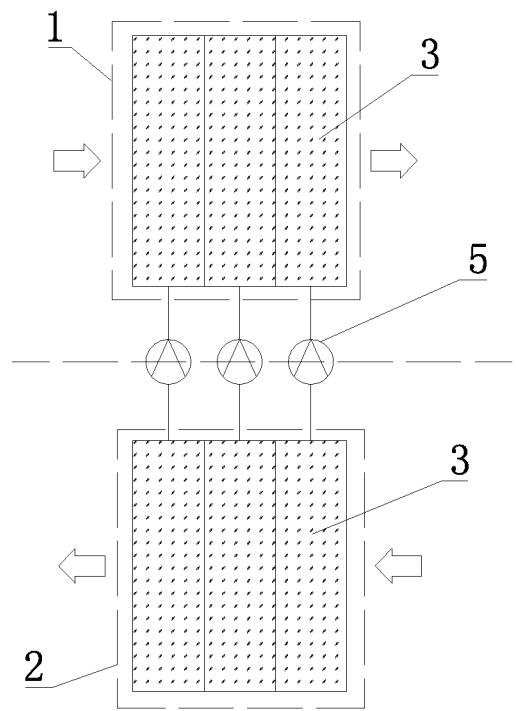
FIG. 2 is a schematic structural diagram of Embodiment 2 of the present invention.
Figure 3:
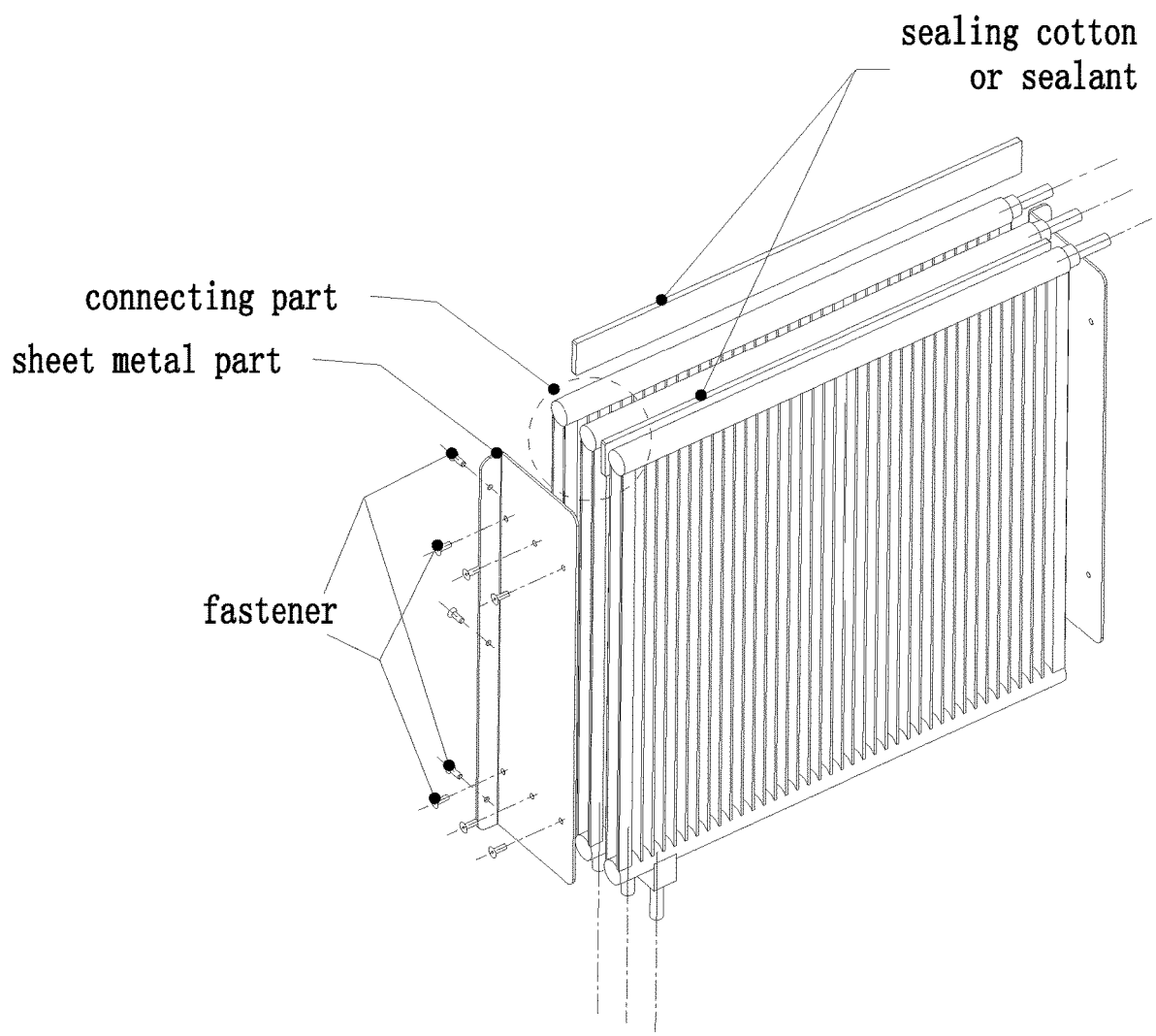
FIG. 3 is a schematic structural diagram illustrating the sealing and attachment elements of the present invention.

As shown in FIG. 2, the difference between the present embodiment and the embodiment 1 is that the pipes connecting the parallel-flow heat exchangers in the condenser unit 1 and the parallel-flow heat exchangers in the evaporator unit 2 in the present embodiment are correspondingly connected, the air flow outside the cabinet is also subjected to heat exchange through three parallel-flow heat exchangers with gradually increasing refrigerant temperature in sequence, and the air flow inside the cabinet is subjected to heat exchange through three parallel-flow heat exchangers with gradually decreasing refrigerant temperature in sequence, so that sufficient heat exchange of the heat exchanger is ensured, and the space in the cabinet can be fully utilized, no longer limited by the height and width, so that the heat exchange design is miniaturized and convenient.

The number of the parallel-flow heat exchangers in the condenser unit and the evaporator unit of the present invention can be set according to requirements. The adjacent parallel-flow heat exchangers can be connected by rivets or screws, or sheet metal parts. When using the sheet metal parts to connect, the sheet metal parts can be disposed at the connecting part of the adjacent parallel-flow radiator. The sheet metal part act as not only a connection but also a seal, the sheet metal part acting as a seal can prevent air leakage in the gap between the adjacent parallel-flow heat exchangers; the coolant can be secondary refrigerants. The design can be directed only to the evaporator unit, so that the evaporator unit includes N pieces of parallel-flow heat exchangers arranged adjacently, N≥2; the coolant temperatures of the first to Nth parallel-flow heat exchangers reduce gradually along the air flow direction in the evaporator unit.

The above description is merely embodiments of the present invention, and is not intended to limit the scope of the present invention, although the present invention has been described in detail with reference to the above embodiments, it should be understood by those skilled in the art that the specific embodiments of the present invention can be modified or replaced equivalently, and any modification or equivalent replacement which does not depart from the spirit and scope of the present invention shall be covered by the scope of the claims of the present invention.

What is claimed is:
1. A heat exchanger module, comprising:
a condenser unit, and
an evaporator unit;
wherein
the evaporator unit comprises N pieces of first parallel heat exchangers, and the first parallel heat exchangers are arranged adjacently, wherein N=3;

a first plurality of coolant temperatures of the first to the Nth pieces of the first parallel heat exchangers along an air flow direction in the evaporator unit reduce gradually;

wherein the condenser unit comprises a corresponding number of pieces of second parallel heat exchangers to the N pieces of the first parallel heat exchangers, a second plurality of coolant temperatures of the first to the Nth pieces of the second parallel heat exchangers along an air flow direction in the condenser unit increase gradually, wherein the second parallel heat exchangers are integrally connected by screws or rivets and sealing cotton, where the sealing cotton prevents air leakage in gaps between the second parallel heat exchangers; and wherein a first parallel heat exchanger of the evaporator unit is connected to a third parallel flow heat exchanger of the condenser unit by a first coolant pipe; a second parallel heat exchanger of the evaporator unit is connected to a second parallel flow heat exchanger of the condenser unit by a second coolant pipe; and a third parallel heat exchanger of the evaporator unit is connected to a first parallel flow heat exchanger of the condenser unit by a third coolant pipe.

2. The heat exchanger module according to claim 1, wherein each piece of the first parallel heat exchangers connected to each piece of the second parallel flow heat exchangers by the first, second and third coolant pipes constitute an independent coolant circulation system.

3. The heat exchanger module according to claim 2, wherein an internal fluid of the independent coolant circulation system is a refrigerant or a secondary refrigerant.

4. The heat exchanger module according to claim 2, wherein a circulation pump is arranged in the independent coolant circulation system.

5. The heat exchanger module according to claim 1, wherein the first parallel heat exchangers are integrally mounted by a first plurality of fasteners, and the second parallel heat exchangers are integrally mounted by a second plurality of fasteners.

6. The heat exchanger module according to claim 1, wherein each of a plurality of connecting parts of the first parallel heat exchangers and the second parallel heat exchangers is provided with the sealing cotton.

7. The heat exchanger module according to claim 1, wherein the first parallel heat exchangers are integrally mounted by a first plurality of sheet metal parts, and the second parallel heat exchanger are integrally mounted by a second plurality of sheet metal parts.

8. The heat exchanger module according to claim 7, wherein the first plurality of sheet metal parts are arranged at a first plurality of connecting parts of the first parallel heat exchangers, and the second plurality of sheet metal parts are arranged at a second plurality of connecting parts of the second parallel heat exchangers.

9. The heat exchanger module according to claim 2, wherein the first parallel heat exchangers are integrally mounted by a first plurality of fasteners, and the second parallel heat exchangers are integrally mounted by a second plurality of fasteners.

10. The heat exchanger module according to claim 2, wherein each of a plurality of connecting parts of the first parallel heat exchangers and the second parallel heat exchangers is provided with the sealing cotton.

11. The heat exchanger module according to claim 3, wherein the first parallel heat exchangers are integrally mounted by a first plurality of sheet metal parts, and the second parallel heat exchangers are integrally mounted by a second plurality of sheet metal parts.

12. The heat exchanger module according to claim 3, wherein the first parallel heat exchangers are integrally mounted by a first plurality of fasteners, and the second parallel heat exchangers are integrally mounted by a second plurality of fasteners.

13. The heat exchanger module according to claim 3, wherein each of a plurality of connecting parts of the first parallel heat exchangers and the second parallel heat exchangers is provided with the sealing cotton.

14. The heat exchanger module according to claim 4, wherein the first parallel heat exchangers are integrally mounted by a first plurality of fasteners, and the second parallel heat exchangers are integrally mounted by a second plurality of fasteners.

15. The heat exchanger module according to claim 4, wherein each of a plurality of connecting parts of the first parallel heat exchangers and the second parallel heat exchangers is provided with the sealing cotton.

16. The heat exchanger module according to claim 3, wherein a circulation pump is arranged in the independent coolant circulation system.

17. The heat exchanger module according to claim 16, wherein the first parallel heat exchangers are integrally mounted by a first plurality of fasteners, and the piece of the second parallel heat exchangers are integrally mounted by a second plurality of fasteners.

18. The heat exchanger module according to claim 16, wherein each of a plurality of connecting parts of the first parallel heat exchangers and the second parallel heat exchangers is provided with the sealing cotton.

19. A heat exchanger module, comprising:
a condenser unit comprising at least three parallel heat exchangers;
an evaporator unit comprising at least three parallel heat exchangers;
a first plurality of coolant temperatures of a first to a third parallel heat exchangers along an air flow direction in the evaporator unit reduce gradually;
a second plurality of coolant temperatures of a first to a third parallel heat exchangers along an air flow direction in the condenser unit increase gradually;
the first to the third parallel heat exchangers of the condenser unit are integrally connected by screws or rivets and sealing cotton, where the sealing cotton prevents air leakage in gaps between the first to the third parallel heat exchangers of the condenser unit; and
the first to the third parallel heat exchangers of the evaporator unit are connected to the third to the first parallel flow heat exchangers of the condenser unit by three coolant pipes, wherein the first parallel heat exchanger of the evaporator unit is connected to the third parallel flow heat exchanger of the condenser unit by a first coolant pipe of the three coolant pipes; the second parallel heat exchanger of the evaporator unit is connected to the second parallel flow heat exchanger of the condenser unit by a second coolant pipe of the three coolant pipes, and the third parallel heat exchanger of the evaporator unit is connected to the first parallel flow heat exchanger of the condenser unit by a third coolant pipe of the three coolant pipes.

* * * * *